(12) United States Patent
Huang et al.

(10) Patent No.: US 8,931,906 B2
(45) Date of Patent: Jan. 13, 2015

(54) LIGHT EMITTING UNIT ARRAY AND PROJECTION SYSTEM

(75) Inventors: Chen-Yang Huang, Hsinchu County (TW); Chia-Hsin Chao, Taichung (TW); Wen-Yung Yeh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 629 days.

(21) Appl. No.: 13/218,479

(22) Filed: Aug. 26, 2011

(65) Prior Publication Data

US 2012/0050694 A1    Mar. 1, 2012

Related U.S. Application Data

(60) Provisional application No. 61/377,462, filed on Aug. 27, 2010.

(30) Foreign Application Priority Data

Aug. 18, 2011    (TW) .............................. 100129591 A

(51) Int. Cl.
*G03B 21/28* (2006.01)
*H01L 33/10* (2010.01)
*H01L 33/08* (2010.01)
(Continued)

(52) U.S. Cl.
CPC .......... *H01L 27/156* (2013.01); *G03B 21/2033* (2013.01); *H01L 33/0079* (2013.01); *H01L 33/405* (2013.01); *H01L 33/46* (2013.01)
USPC ................... 353/37; 353/38; 353/99; 257/88; 257/98; 257/100; 362/311.02

(58) Field of Classification Search
USPC ......... 353/30, 31, 37, 38, 98, 99; 362/311.02; 257/98, 88, 100, E33.069
See application file for complete search history.

(56) References Cited

U.S. PATENT DOCUMENTS 6,320,206 B1    11/2001    Coman et al.
6,420,199 B1    7/2002    Coman et al.
(Continued)

FOREIGN PATENT DOCUMENTS

| CN | 1956231 | 5/2007 |
| CN | 101627482 | 1/2010 |
| TW | 200746471 | 12/2007 |

OTHER PUBLICATIONS

"Office Action of Taiwan Counterpart Application", issued on Nov. 7, 2013, p. 1-p. 7.
(Continued)

*Primary Examiner* — John Lee
(74) *Attorney, Agent, or Firm* — Jianq Chyun IP Office

(57) ABSTRACT

A light emitting unit array including a plurality of micro-light emitting diodes (μ-LEDs) is provided. The micro-light emitting diodes are arranged in an array on a substrate, and each of the micro-light emitting diodes includes a reflection layer, a light emitting structure, and a light collimation structure. The light emitting structure is disposed on the reflection layer, and includes a first type doped semiconductor layer, an active layer, and a second type doped semiconductor layer that are stacked sequentially. At least a portion of the first type doped semiconductor layer, the active layer, and the second type doped semiconductor layer are sandwiched between the reflection layer and the light collimation structure.

20 Claims, 21 Drawing Sheets

(51) Int. Cl.
*H01L 27/15* (2006.01)
*G03B 21/20* (2006.01)
*H01L 33/00* (2010.01)
*H01L 33/40* (2010.01)
*H01L 33/46* (2010.01)

(56) References Cited

U.S. PATENT DOCUMENTS

| | | | |
|---|---|---|---|
| 6,547,400 B1* | 4/2003 | Yokoyama | 353/98 |
| 6,653,660 B2 | 11/2003 | Takaoka | |
| 6,826,223 B1 | 11/2004 | Meyer et al. | |
| 6,975,294 B2* | 12/2005 | Manni et al. | 345/83 |
| 7,009,215 B2 | 3/2006 | D'Evelyn et al. | |
| 7,013,072 B2* | 3/2006 | Kinoshita | 385/131 |
| 7,019,330 B2 | 3/2006 | Ludowise | |
| 7,122,446 B2* | 10/2006 | Nitta et al. | 438/458 |
| 7,131,735 B2* | 11/2006 | Yokoyama | 353/98 |
| 7,307,786 B2* | 12/2007 | Hatjasalo et al. | 359/569 |
| 7,442,964 B2* | 10/2008 | Wierer et al. | 257/98 |
| 7,482,633 B2* | 1/2009 | Chiaretti | 257/89 |
| 7,609,929 B2* | 10/2009 | Seol et al. | 385/125 |
| 7,854,505 B2* | 12/2010 | Cunningham et al. | 351/44 |
| 8,049,233 B2* | 11/2011 | Fukshima et al. | 257/98 |
| 2002/0121643 A1 | 9/2002 | Mizuno et al. | |
| 2002/0196414 A1* | 12/2002 | Manni et al. | 353/31 |
| 2003/0231683 A1 | 12/2003 | Chua et al. | |
| 2004/0247009 A1 | 12/2004 | Noda et al. | |
| 2004/0252741 A1 | 12/2004 | Meyer et al. | |
| 2005/0205883 A1* | 9/2005 | Wierer et al. | 257/98 |
| 2006/0151794 A1* | 7/2006 | Wierer et al. | 257/79 |
| 2007/0034730 A1* | 2/2007 | Mossberg et al. | 244/3.1 |
| 2007/0075318 A1 | 4/2007 | Noda et al. | |
| 2007/0081253 A1 | 4/2007 | Yamauchi | |
| 2007/0090378 A1 | 4/2007 | Lee et al. | |
| 2007/0217466 A1 | 9/2007 | Noda et al. | |
| 2007/0280318 A1 | 12/2007 | Yoshimoto et al. | |
| 2008/0157108 A1* | 7/2008 | Yu et al. | 257/98 |
| 2009/0020777 A1 | 1/2009 | Iwata et al. | |
| 2009/0267092 A1* | 10/2009 | Fukshima et al. | 257/98 |
| 2011/0297975 A1* | 12/2011 | Yeh et al. | 257/88 |
| 2011/0299044 A1* | 12/2011 | Yeh et al. | 353/52 |
| 2012/0050694 A1* | 3/2012 | Huang et al. | 353/38 |

OTHER PUBLICATIONS

B. Corbett et al., "Resonant Cavity Light Emitting Diode and Detector Using Epitaxial Liftoff", IEEE Photonics Technology Letters, vol. 5, No. 9, Sep. 1993, p. 1041-p. 1043.

F. Salomonsson et al., English Abstract of "InP-based 1.55 µm resonant cavity light-emitting diode with two epitaxial mirrors", Physica Scripta, vol. 1999, 1999.

Z.S. Li, "Modeling of GaN Based Resonant-Cavity Light-Emitting Diode", Proc. of SPIE vol. 6486 64860S-1, 2007, p. 1-p. 7.

Song et al., "A blue resonant cavity light-emitting diode", Monday Morning / CLEO 2000 /37, Jul. 21, 2000.

Y.K. Su et al., "1.3 µm InAs quantum dot resonant cavity light emitting diodes", Materials Science and Engineering B 110, Jul. 25, 2004, p. 256-p. 259.

"Office Action of China Counterpart Application", issued on Oct. 30, 2013, p. 1-p. 7.

* cited by examiner

LIGHT EMITTING UNIT ARRAY AND PROJECTION SYSTEM

CROSS-REFERENCE TO RELATED APPLICATION

This application claims the priority benefits of U.S. provisional application Ser. No. 61/377,462, filed on Aug. 27, 2010 and Taiwan application serial no. 100129591, filed on Aug. 18, 2011. The entirety of each of the above-mentioned patent applications is hereby incorporated by reference herein and made a part of this specification.

BACKGROUND OF THE DISCLOSURE

1. Field of the Disclosure

The disclosure relates to a light emitting unit array and display device, and particularly, to a micro-light emitting diode array (μ-LED array) and a projection system using the μ-LED array as the projection imaging source.

2. Description of Related Art

LED has the characteristics of high efficiency, long lifespan, etc. and thus the LED light source has been widely applied. The application of the LED in the micro-projection system facilitates a dramatic revolution of the projection and display products. The micro-projection system can be categorized into stand alone type and buried type. The buried type micro-projection system is achieved by burying the micro-projection system in the already existed devices such as the cell phone, the digital camera, the handheld game consoles, and the like.

For burying the projection system in the portable electronic products, a problem needs to be overcome is the reduction of the volume of the product. The conventional micro-projection techniques including the digital light processing (DLP), the liquid crystal projector (LCP), and the liquid crystal on silicon (LCOS) projection device require a complex optical engine which includes illumination, imaging, and projection sub-systems. Accordingly, it is difficult for such products to achieve high projection brightness and further have small volume, e.g. a projection system with micro-volume (<3 cc).

For resolving the above problem, a micro-projection system deduced from the μ-LED array light source is provided. The μ-LED array light source is served as the imaging source and thus the micro-projection system using the μ-LED array light source does not require the complex optical engine. Generally, merely the μ-LED array light source arranged with a projection lens is sufficient to form a high efficient and super small projection system which has the volume smaller than 3 cc. As a whole, the projection system mentioned above facilitates the buried type design of the micro-projection system which is not easily achieved by other micro-projection techniques.

FIG. 1 illustrates a projection system using the μ-LED array light source. As shown in FIG. 1, the projection system 100 includes the μ-LED array 110 arranged on the substrate 10, the μ-lens array 120, and the projection lens 130. The μ-LED array 110 is an array structure formed by a plurality of μ-LEDs and each of the μ-LEDs is served as a pixel for displaying an image. The μ-lens array 120 is disposed on the μ-LED array 110 and includes a plurality of μ-lens. Each of the μ-lens corresponds to one pixel (i.e. one μ-LED). The projection lens 130 is disposed on a light path of the light emitted from the μ-LED array 110.

FIG. 2 is a diagram showing the light path of the light emitted from the μ-LED array of the projection system depicted in FIG. 1. FIG. 3 shows the far field intensity distribution of the μ-LED array of the projection system depicted in FIG. 1. Referring to FIG. 2 and FIG. 3 together, the μ-lens array 120 disposed on the μ-LED array 110 renders the light emitted by the μ-LED array 110 being divided into three groups A, B, and C.

When the μ-LED array 110 displays an image, the two neighboring μ-LEDs can emit the light with different brightness and/or colors to display the required displayed image. However, as shown in FIG. 2 and FIG. 3, the light belonging to the group B and group C emitted from each of the μ-LEDs is emitted obliquely so that the light from each μ-LED can be interfered by the light from the neighboring μ-LED, which is called the optical cross talk effect. Herein, the projection system 100 may have poor imaging quality owing to the optical cross talk effect. For example, the contrast of the projected image is reduced and the projection brightness is decreased. In view of the above, it is an important issue to collimate the light emitted from the μ-LED array 110 when the μ-LED array 110 is applied in the projection system.

SUMMARY OF THE DISCLOSURE

The disclosure directs to a light emitting unit array including a plurality of μ-LEDs. The μ-LEDs are arranged in an array on a substrate, and each of the μ-LEDs includes a reflection layer, a light emitting structure, and a light collimation structure. The light emitting structure is disposed on the reflection layer, and includes a first type doped semiconductor layer, an active layer, and a second type doped semiconductor layer that are stacked sequentially. At least a portion of the first type doped semiconductor layer, the active layer, and the second type doped semiconductor layer are sandwiched between the reflection layer and the light collimation structure.

The disclosure further directs to a light emitting unit array including a plurality of μ-LEDs arranged in an array on a substrate. Each of the μ-LEDs includes a reflection layer, a light emitting structure, and a first photonic crystal structure layer. The light emitting structure is disposed on the reflection layer, and includes a first type doped semiconductor layer, an active layer, and a second type doped semiconductor layer that are stacked sequentially. The first type doped semiconductor layer, the active layer, and the second type doped semiconductor layer are sandwiched between the reflection layer and the first photonic crystal structure layer.

The disclosure still directs to a projection system including a display unit array and a projection lens set. The display unit array includes a plurality of μ-LEDs arranged in an array on a substrate. Each of the μ-LEDs includes a reflection layer, a light emitting structure, and a light collimation structure. The light emitting structure is disposed on the reflection layer, and includes a first type doped semiconductor layer, an active layer, and a second type doped semiconductor layer that are stacked sequentially. At least a portion of the first type doped semiconductor layer, the active layer, and the second type doped semiconductor layer are sandwiched between the reflection layer and the light collimation structure. The projection lens set is located at the light path of the displaying light of the display unit array.

In order to make the aforementioned and other objects, features and advantages of the disclosure more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
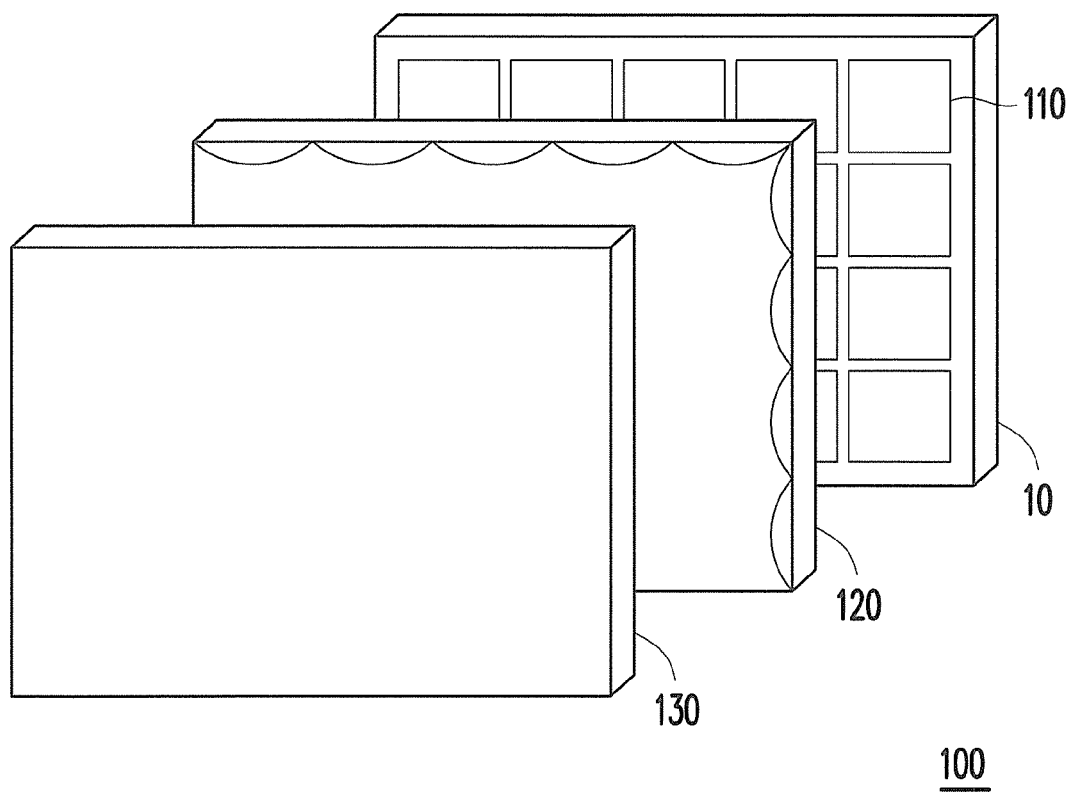
FIG. 1 illustrates a conventional projection system using the μ-LED array light source.
Figure 2:
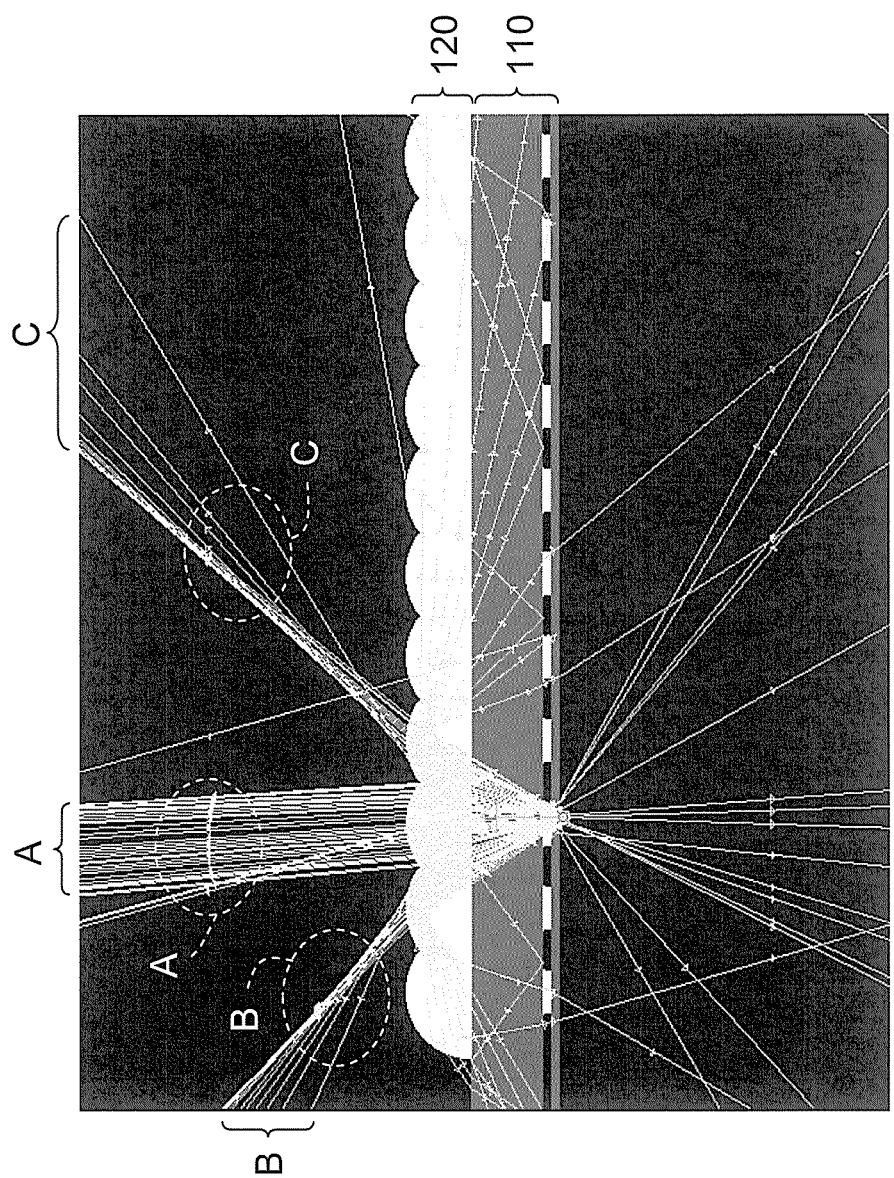
FIG. 2 is a diagram showing the light path of the light emitted from the μ-LED array of the projection system depicted in FIG. 1.
Figure 3:
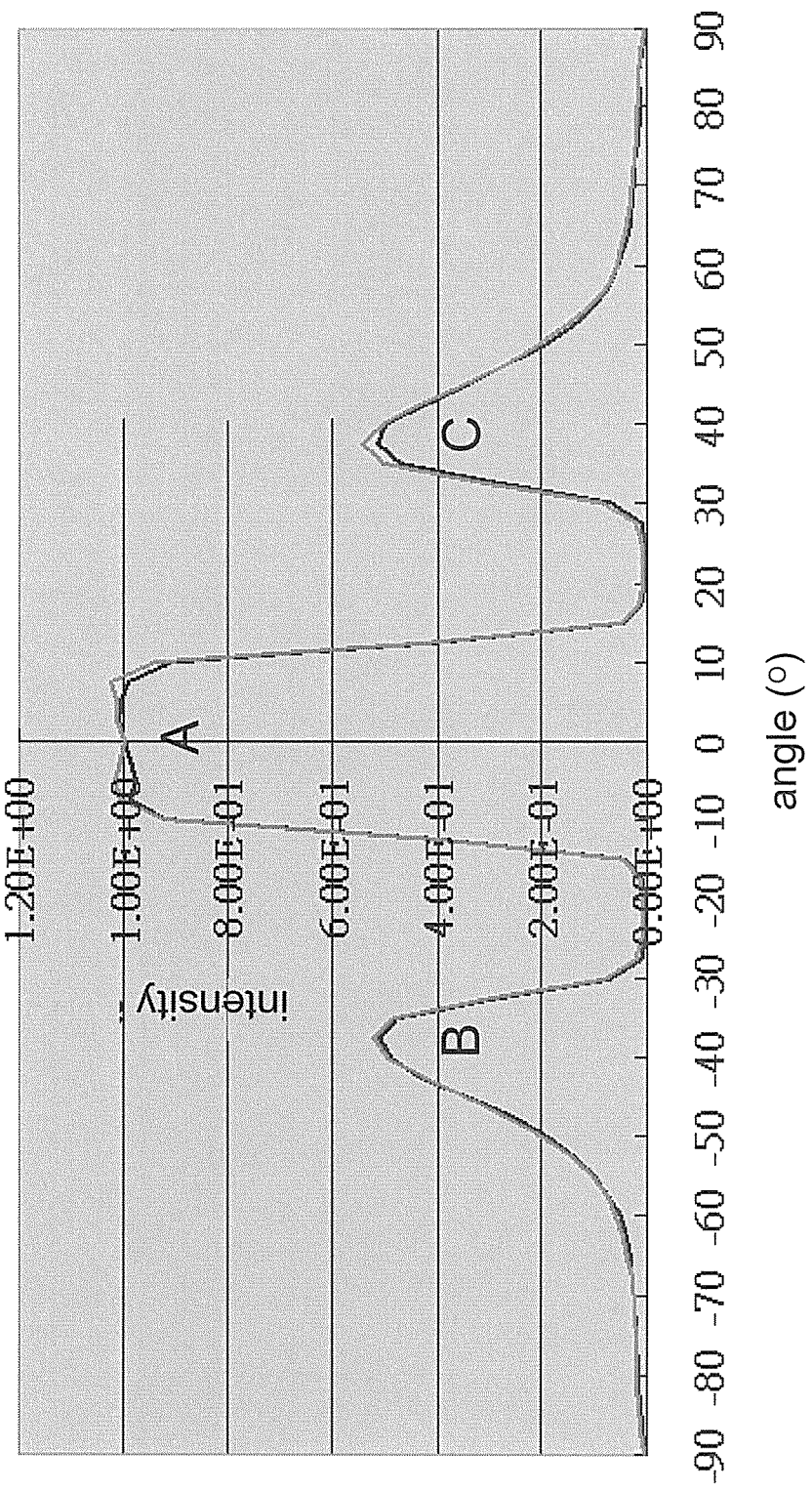
FIG. 3 shows the far field intensity distribution of the μ-LED array of the projection system depicted in FIG. 1.

For achieving a projection system with reduced total volume and desirable imaging quality, each of the μ-LEDs configured in the μ-LED array for displaying images are requested to provide desirable light collimation effect. In other words, by serving the normal direction of the display surface as the zero degree angle direction, the light emitted from the μ-LED is preferably emitted in the zero degree angle or the scattering angle of the emitting light is located within small angle range (such as ±30 degrees). In the conventional design as shown in FIG. 2 and FIG. 3, a portion of the light emitted from the μ-LED still belongs to the group B and the group C when the μ-LED is combined with the μ-lens array. Accordingly, for having desirable light collimation effect, the light emitting unit array formed by the μ-LEDs needs to be improved. The following descriptions exemplarily depict several light emitting unit arrays rendering the μ-LEDs in the light emitting unit array to have desirable light collimation effect and desirable light emitting efficiency. The application of the light emitting unit array in the projection system is conducive to enhancing the imaging quality thereof. It is noted that the light emitting unit array though are exemplarily applied in the projection system for displaying images, the disclosure is not limited thereto. The light emitting unit array of the disclosure can be applied in any product or design requiring the desirable light collimation effect.

Embodiments of the present disclosure will be described below. However, these embodiments are not intended for limiting the scope of the disclosure. Besides, some of the embodiments may be combined appropriately to produce other different embodiments of the present disclosure.

Figure 4A:
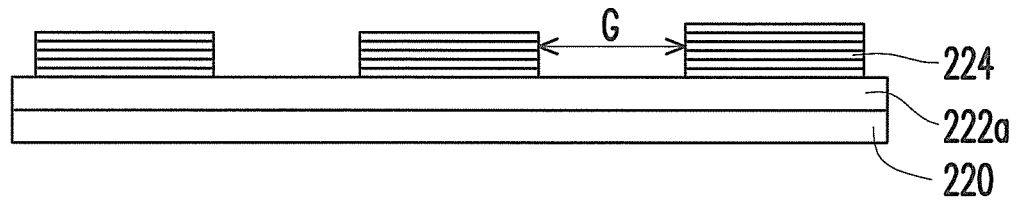
FIGS. 4a through 4i depict a fabricating method of a light emitting unit array according to a first embodiment of the disclosure.

FIGS. 4a through 4i depict a fabricating method of a light emitting unit array according to a first embodiment of the disclosure. Referring to FIG. 4a, a doped semiconductor material thin layer 222a and a plurality of light collimation structures 224 are formed on a substrate 220. In the embodiment, the substrate 220 is, for example, a sapphire substrate or other suitable substrate facilitating applying in the epitaxy process. The light collimation structures 224 are arranged in an array on the doped semiconductor material thin layer 222a and two adjacent light collimation structures 224 are separated by a gap G. The light collimation structures 224 are formed on the doped semiconductor material thin layer 222a by an optical coating process, for example.

In the present embodiment, the light collimation structures 224 can be distributed Bragg reflectors (BDRs). Namely, the light collimation structures 224 are the multi-layers formed by material layers with different refractive index, such as $Ta_2O_5/SiO_2$ multi-layers, $Nb_2O_5/SiO_2$ multi-layers, $TiO_2/SiO_2$ multi-layers, $Al_2O_3/SiO_2$ multi-layers, or $ITO/SiO_2$ multi-layers. The reflectivity of the light collimation structures 224 can be determined by the layer numbers of the multi-layers and the thickness of the material layers. In addition, the light collimation structures 224 can be omni-directional reflectors (ODRs) which is the multi-layers formed by alternatively stacking a metal material layer and an oxide material layer such as $Al/SiO_2$ multi-layers, $Ag/SiO_2$ multi-layers, and the like.

Figure 4B:
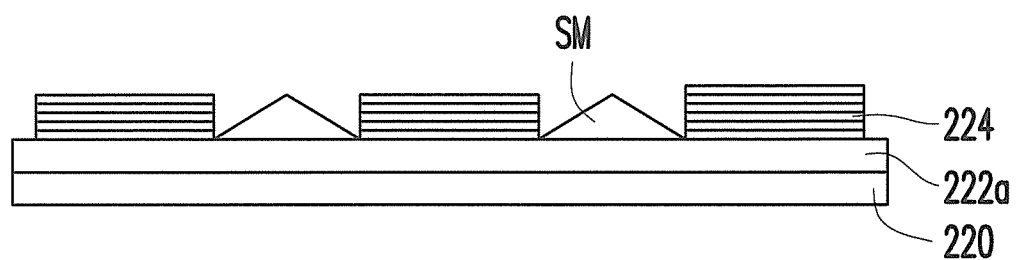
Figure 4C:
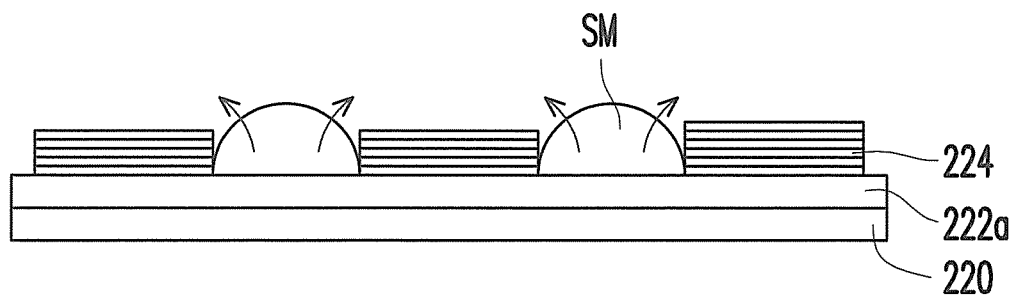
Figure 4D:
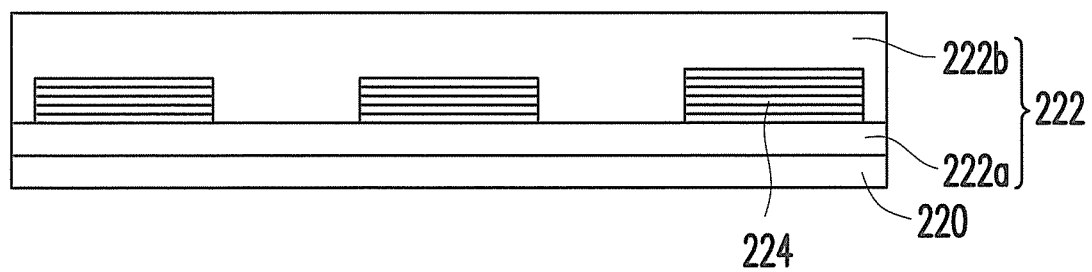

Then, referring to FIG. 4b through FIG. 4d, by using the lateral epitaxy technique, the semiconductor material SM is grown in the portion of the doped semiconductor material thin layer 222a exposed by the gap G and subsequently, the thickness of the semiconductor material SM is increased to form the doped semiconductor material thin layer 222b. Herein, the doped semiconductor material thin layers 222a and 222b are formed by the semiconductor material SM with the same doped type to define the first type doped semiconductor layer 222. As shown in FIG. 4d, the light collimation structures 224 are buried in the first type doped semiconductor layer 222.

Figure 4E:
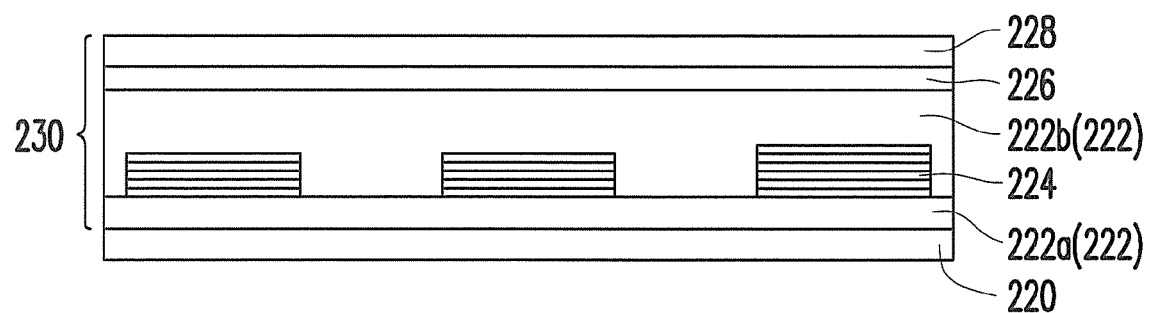

Thereafter, referring to FIG. 4e, an active layer 226 and a second type doped semiconductor layer 228 are formed on the first type doped semiconductor layer 222, wherein the active layer 226 is located between the first type doped semiconductor layer 222 and the second type doped semiconductor layer 228 to construct the light emitting structure layer 230. The active layer 226 can be a multiple quantum well (MQW) layer, but this should by no means limit the scope of the disclosure. The material of the first type doped semiconductor layer 222 and the second type doped semiconductor layer 228 can be respectively an n-type doped semiconductor layer and a p-type doped semiconductor layer or respectively a p-type doped semiconductor layer and an n-type doped semiconductor layers. The n type doped semiconductor material and the p type doped semiconductor material selected in the present embodiment can, for example, be an n type and a p type doped GaN. Nevertheless, in one embodiment, the n type doped semiconductor material and the p type doped semiconductor material can be other semiconductor materials doped with the required dopant such as GaAlN, GaInN, or other III-V group nitride.

Figure 4F:
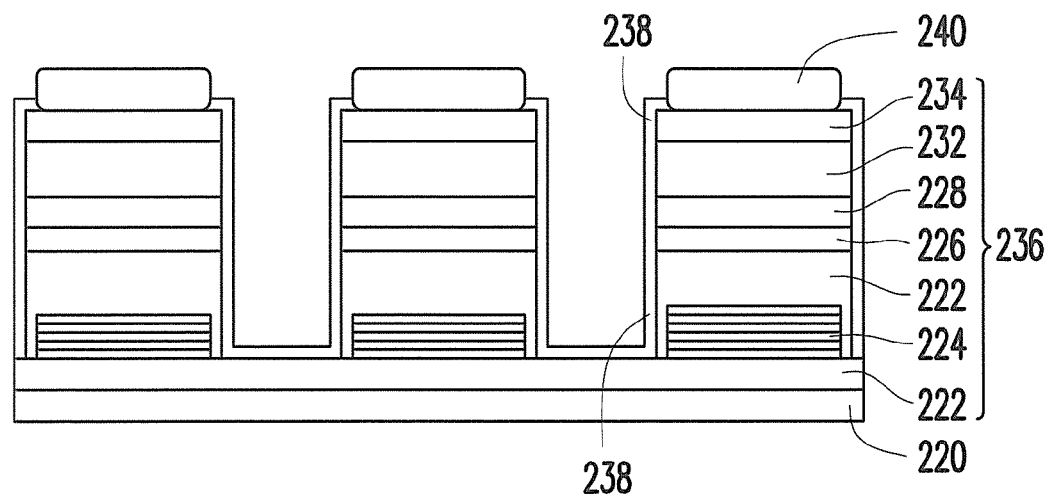

Subsequently, referring to FIG. 4f, the contact layer 232 and the reflection layer 234 are formed in sequence on the light emitting structure layer 230, and then the stack constructed by the light emitting structure layer 230, the contact layer 232, and the reflection layer 234 are patterned into a plurality of μ-LEDs 236 arranged in an array. The material of the reflection layer 234 can be Al, Ag, Au, or a combination thereof and the material of the contact layer 232 can be Ni/Au, Ni/Al/Ag, Ni/Ag, etc. Thereafter, the protection layer 238 is formed to cover the side surfaces of the μ-LEDs 236 and a plurality of electrode 240 are respectively formed on the reflection layers 234 of the μ-LEDs 236. In the present embodiment, the contact layer 232 can be an ohmic contact layer and the reflection layer 234 can a metal reflection layer. As such, the reflection layer 234 can provide the electrically conducting effect in addition to the reflection effect. Furthermore, the contact layer 232 is disposed between the reflection layer 234 and the second type doped semiconductor layer 228 so that the dope type of the contact layer 232 can be the same to that of the second type doped semiconductor layer 228.

In specific, the first type doped semiconductor layer 222 are partially connected to form a continuous layer structure among these μ-LEDs 236. That is to say, the first type doped semiconductor layer 222 is not completely broken during the patterning process and is still a continuous layer. Therefore, the protection layer 238 merely covers a portion of the side surface of the first type doped semiconductor layer 222, the side surface of the active layer 226, the side surface of the second type doped semiconductor layer 228, the side surface of the contact layer 232, the side surface of the reflection layer 234 and a portion of the upper surface of the reflection layer 234 away from the contact layer 232.

Figure 4G:
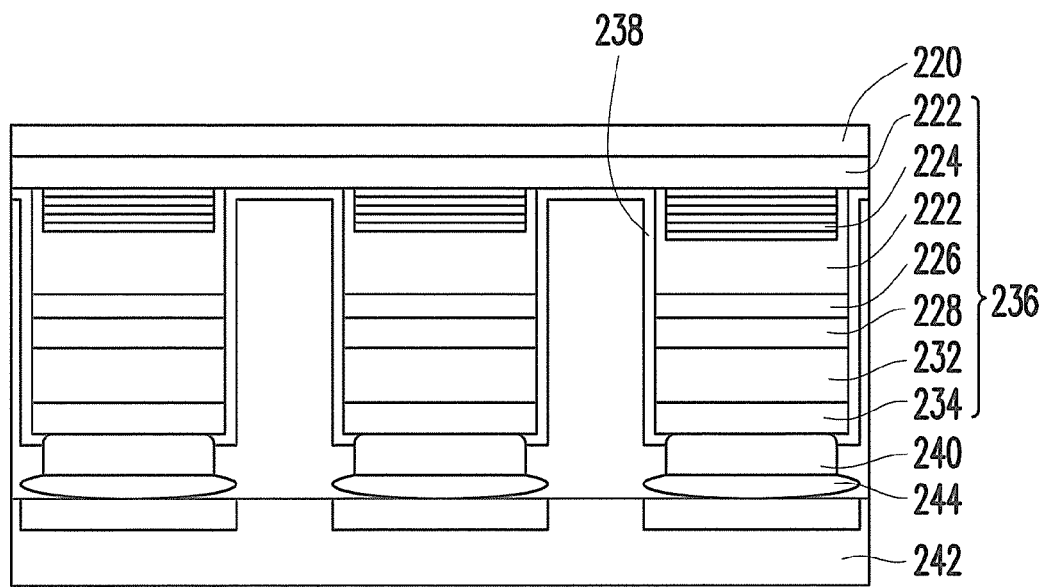

Then, referring to FIG. 4g, a bonding process is performed to bond the electrode 240 of each μ-LED 236 to another substrate 242, wherein the electrode 240 can be bonded to the substrate 242 through the metal pad 244 and the metal pad 244 can be formed by metal such as Au, Cu, Sn, In, etc., the stack thereof or the alloy thereof. In the present embodiment, the substrate 242 can be the silicon substrate configured with circuit elements such as MOS elements, transistors, or the like.

Figure 4H:
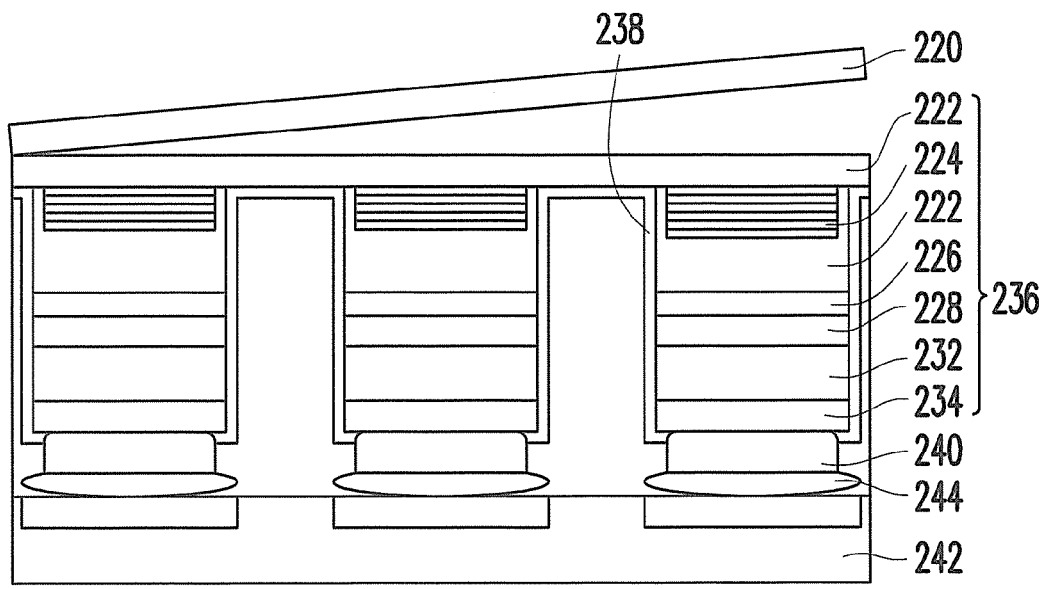
Figure 4I:
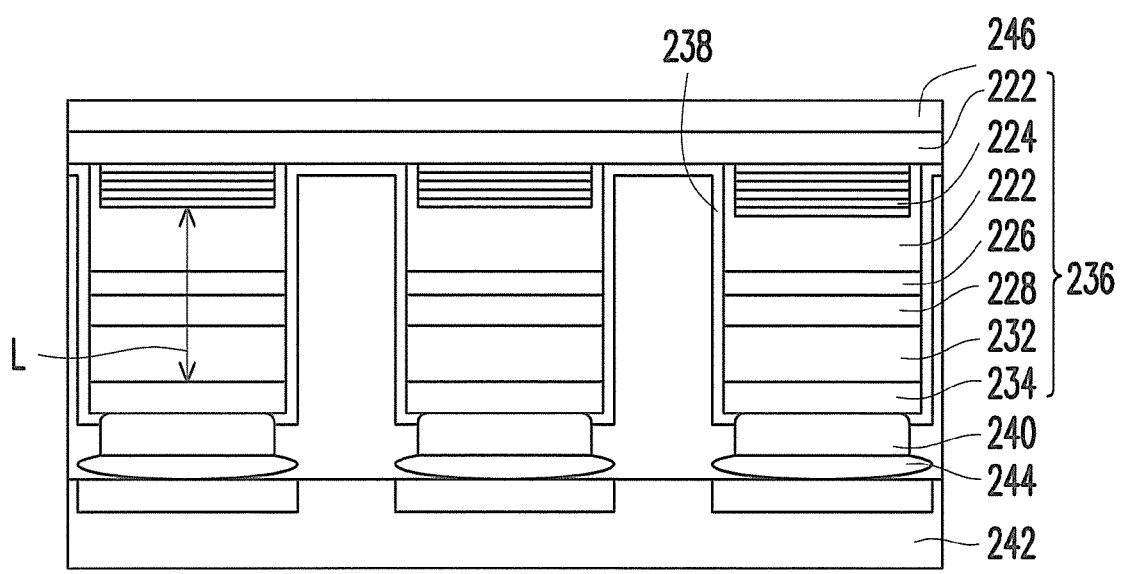

Subsequently, referring to FIG. 4h, the substrate 220 are separated from the μ-LEDs 236, wherein the method of separating the substrate 220 can be the laser lift-off process. After separating the substrate 220 from the μ-LEDs 236, the surface of the first type doped semiconductor layer 222 away from the active layer 226 can be exposed. Referring to FIG. 4i, the transparent conductive layer 246 is formed on the exposed first type doped semiconductor layer 222 to construct the light emitting unit array 200. A material of the transparent conductive layer 246 is, for example, indium tin oxide (ITO), indium zinc oxide (IZO), aluminum zinc oxide (AZO), Gallium-doped Zinc Oxide (GZO), Ni/Au, or other transparent conductive materials.

The light emitting unit array 200 is formed by the plurality of μ-LEDs 236 disposed on the substrate 242, which means each μ-LED 236 is served as a light emitting unit. In the present embodiment, the substrate 242 is configured with circuit elements thereon such that each μ-LED 236 can be driven independently to emit the light with variant brightness and/or colors, thereby the light emitting unit array 200 can directly display images. In other words, the light emitting unit array 200 can be served as a display panel rather than merely served as a light source.

A portion of the first type doped semiconductor layer 222, the active layer 226, and the second type doped semiconductor layer 228 are sandwiched between the reflection layer 234 and the light collimation structure 224 in each μ-LED 236. The light collimation structure 224 has the characteristic of reflecting light and the active layer 226 capable of emitting light is located between the reflection layer 234 and the light collimation structure 224. Accordingly, when the thickness of the μ-LED 236 is properly configured, the reflection layer 234 and the light collimation structure 224 can form a resonance structure, which allowing the light emitted from the active layer 226 to resonate between the reflection layer 234 and the light collimation structure 224 and to emit with desirable collimation. In one embodiment, a thickness L of the μ-LED 236 located between the light collimation structure 224 and the reflection layer 234 and the wavelength λ of the light emitted from the active layer 226 complies with L=n/2λ while n is an integer and ranges between 3 and 20. By such arrangement, the light emitted by the active layer 226 can be emitted from the μ-LED 236 with desirable collimation.

Figure 5B:
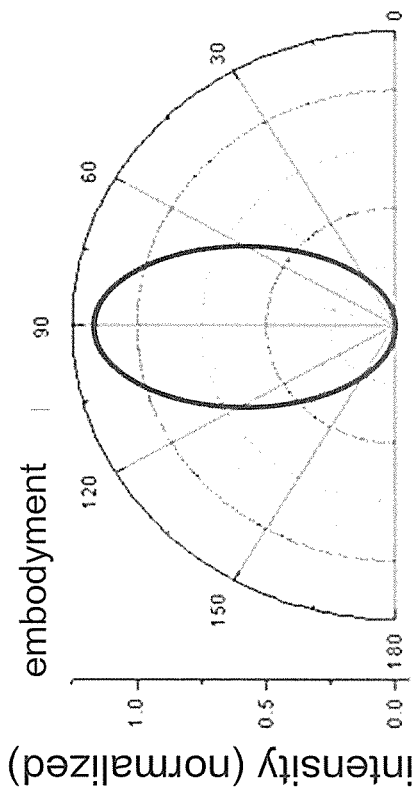
FIG. 5a and FIG. 5b respectively shows the far field distribution of the conventional μ-LED and that of the μ-LED of the present embodiment.
Figure 5A:
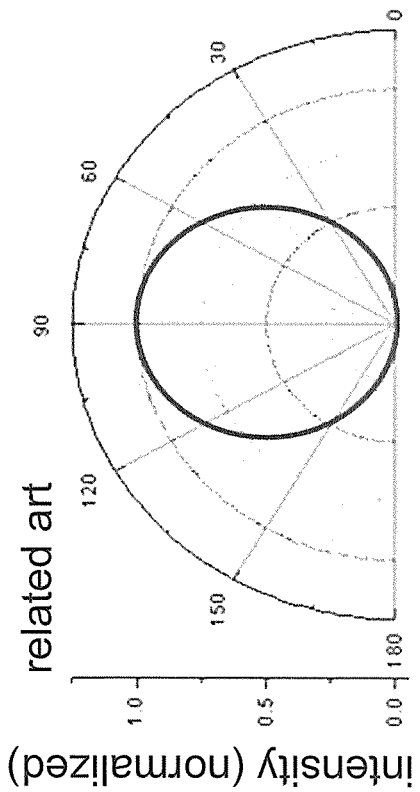

FIG. 5a and FIG. 5b respectively shows the far field distribution of the conventional μ-LED and that of the μ-LED of the present embodiment. As shown in FIG. 5a and FIG. 5b, the far field distributions of the conventional μ-LED substantially forms a circle (half angle of the emitting light is located in the range about <±60°) and the far field distributions of the μ-LED 236 of the present embodiment is relatively narrow (half angle of the emitting light is located in the range about <±30°). It is thus evident that the emitting angle of the μ-LED 236 of the present embodiment is relatively narrowed so as to achieve better light collimation effect.

Figure 6:
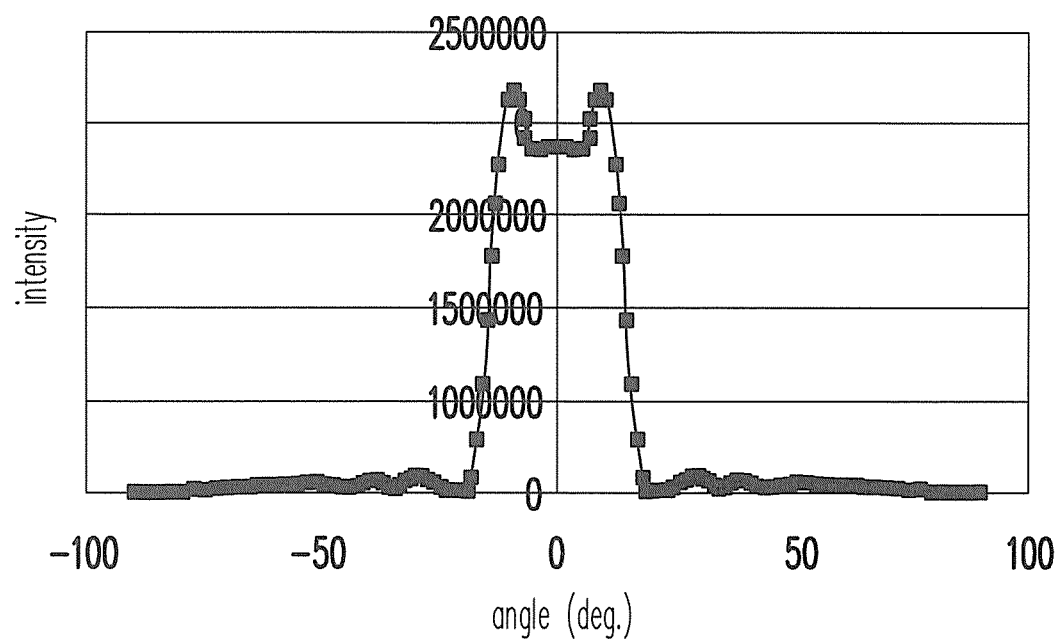
FIG. 6 shows the relationship between the far field intensity of the μ-LED in the light emitting unit array of the first embodiment of the disclosure corresponding to different viewing angles while the μ-LED is combined with a μ-lens.

FIG. 6 shows the far field intensity distribution of the μ-LED in the light emitting unit array of the first embodiment of the disclosure corresponding to different viewing angles while the μ-LED is combined with a μ-lens. As shown in FIG. 6, by being combined with the μ-lens, the light emitted by the μ-LED 236 of the present embodiment can be emitted in the limited angle around the zero degree viewing angle. With comparison to the conventional design as shown in FIG. 3, the intensity of the light belonging to the group B and the group C in FIG. 3 is significantly reduced in the present embodiment. Consequently, the μ-LED 236 of the present embodiment obviously has better light collimation effect and the light obliquely emitted is strongly prohibited.

More specifically, table 1 shows the light emitting efficiency of the light emitting unit arrays formed by the μ-LEDs of the present embodiment and formed by the conventional μ-LEDs.

| Pitch between the μ-LEDs | Size of the μ-LED | Shape of the emitted light | Combined with μ-lens | Light emitting efficiency |
|---|---|---|---|---|
| 30 μm | 15 μm | Conventional μ-LED (light emitting angle 120°) | no | 6.2% |
| | | the μ-LED of the present embodiment (light emitting angle 60°) | no | 8.6% |
| | | Conventional μ-LED (light emitting angle 120°) | Yes | 21.7% |
| | | the μ-LED of the present embodiment (light emitting angle 60°) | Yes | 38.9% |

As shown in table 1, no matter whether being combined with the μ-lens or not, the μ-LED 236 of the present embodiment can have better light emitting efficiency than the conventional μ-LED.

Figure 7:
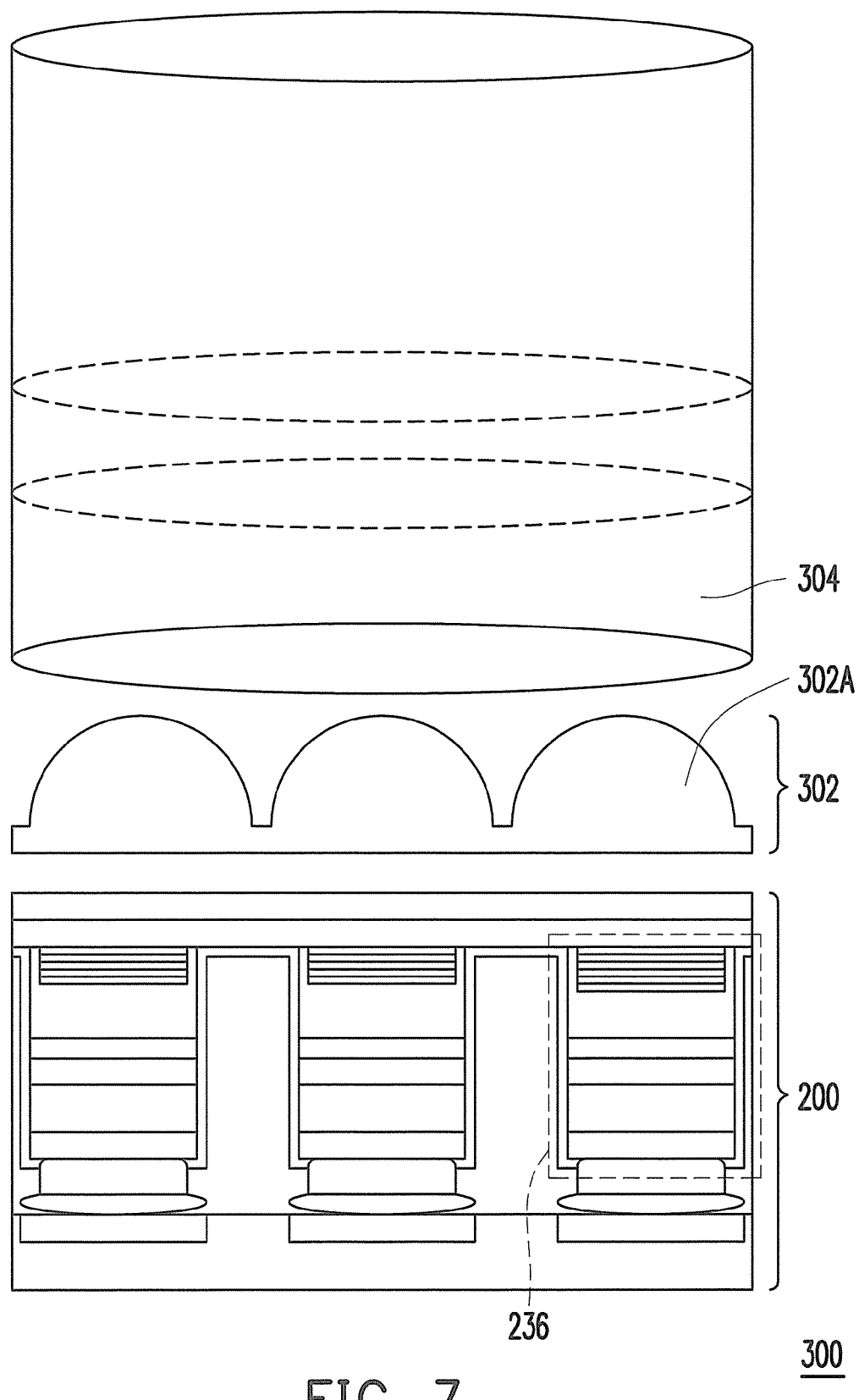
FIG. 7 schematically illustrates a projection system applying the light emitting unit array of the first embodiment of the disclosure.

FIG. 7 schematically illustrates a projection system applying the light emitting unit array of the first embodiment of the disclosure. Referring to FIG. 7, the projection system 300 includes the light emitting unit array 200, the μ-lens array 302, and the projection lens 304. The μ-lens array 302 is exemplarily disposed on the light emitting unit array 200, wherein the μ-lens array 302 is consisted of multiple of μ-lens 302A and each μ-lens 302A corresponds to one μ-LED 236. The projection lens 304 is disposed at the light path of the light of the light emitting unit array 200.

The μ-LEDs 236 in the light emitting unit array 200 can independently emit the light with different colors and/or intensity for displaying images so that the light emitting unit array 200 can be served as a display unit array. Therefore, the projection system 300 according to the present embodiment does not include any additional display panel, which facilitates to reduce the total volume thereof. In addition, according to those shown in FIGS. 5a, 5b, and 6 and table 1, the light emitting unit array 200 has the light emitting effect of desirable light collimation and high efficiency, and thus the optical cross talk effect is prevented in the projection system 300 to have desirable imaging quality. The application of the light emitting unit array 200 in the projection system 300 is conducive to enhancing the imaging quality thereof. It is noted that the light emitting unit array 200 is not limited to be applied in the projection system 300 while the light emitting unit array 200 can be applied in other products or designs for achieving better light collimation effect. The present embodiment is configured to bury the light collimation structure 224 in the first type doped semiconductor layer 222 of the μ-LED 236, but the light collimation structure 224 can be arranged in other method according to other embodiments.

Figure 8A:
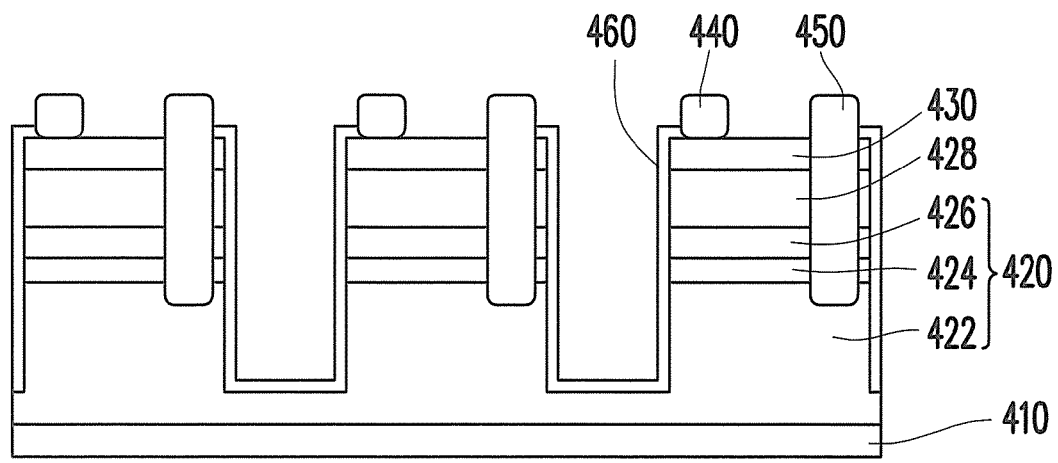
FIGS. 8a through 8e depict a fabricating method of a light emitting unit array according to a second embodiment of the disclosure.

FIGS. 8a through 8e depict a fabricating method of a light emitting unit array according to a second embodiment of the disclosure. It is noted that the materials of the elements and a portion of the fabricating methods thereof in the present embodiment can be referred to the first embodiment, which are not iterated here. Referring to FIG. 8a, a plurality of light emitting structures 420, a plurality of contact layers 428, a plurality of reflection layers 430, a plurality of first electrodes 440, a plurality of second electrodes 450, and a protection layer 460 are formed on the substrate 410. Each light emitting structure 420 includes the first type doped semiconductor layer 422, the active layer 424, and the second type doped semiconductor layer 426 stacking outward from the substrate 410 sequentially. The contact layer 428 is disposed on the second type doped semiconductor layer 426, wherein the first type doped semiconductor layers 422 of the light emitting structures 420 are connected to form a continuous layer. Each reflection layer 430 is disposed on one contact layer 428. Each first electrode 440 is disposed on one of the reflection layers 430 and each second electrode 450 contacts the first type doped semiconductor layer 422 of one light emitting structure 420. The protection layer 460 covers the side surface of the light emitting structure 420, the side surface of the contact layer 428, and the side surface of the reflection layer 430. In the embodiment, the substrate 410 is, for example, a sapphire substrate or other suitable epitaxy substrate.

Figure 8B:
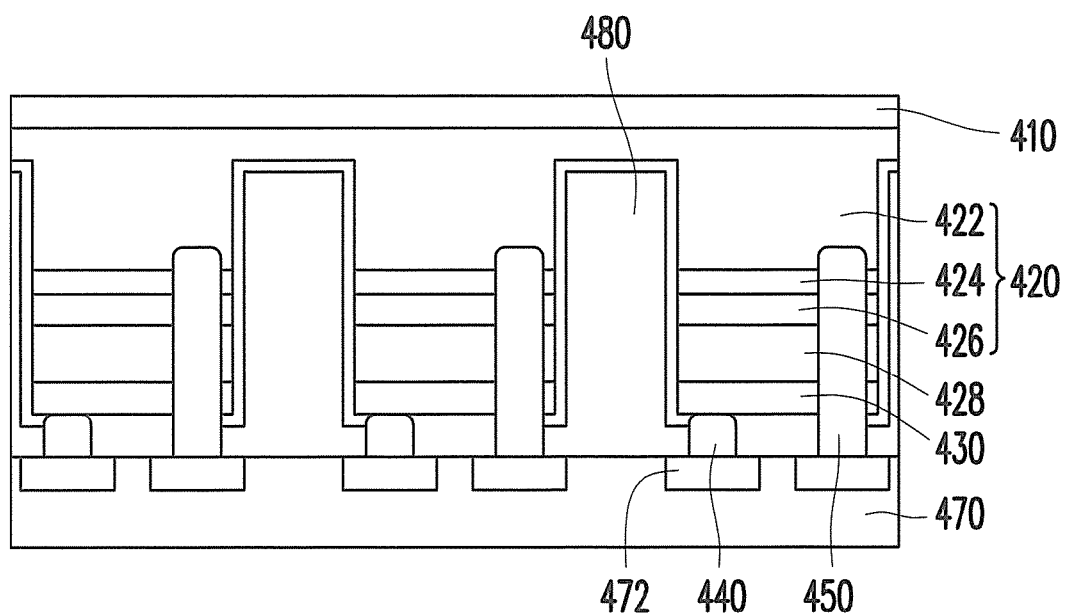

Then, referring to FIG. 8b, a bonding process is performed so that the first electrodes 440 and the second electrodes 450 are bonded to the substrate 470. In addition, the gap between the light emitting structures 420 can be filled with the filling layer 480. The substrate 470 can be silicon substrate and the circuit elements 472 can be disposed thereon. The circuit elements 472 are electrically connected to the first electrodes 440 and the second electrodes 450 to drive the light emitting structures 420. Herein, the light emitting structures 420 are driven independently to emit the light of different brightness and/or colors so that the light emitting structures 420 can be served as the pixels that display images. Accordingly, the array formed by the light emitting structures 420 can be a pixel array or a display unit array for displaying images.

Figure 8C:
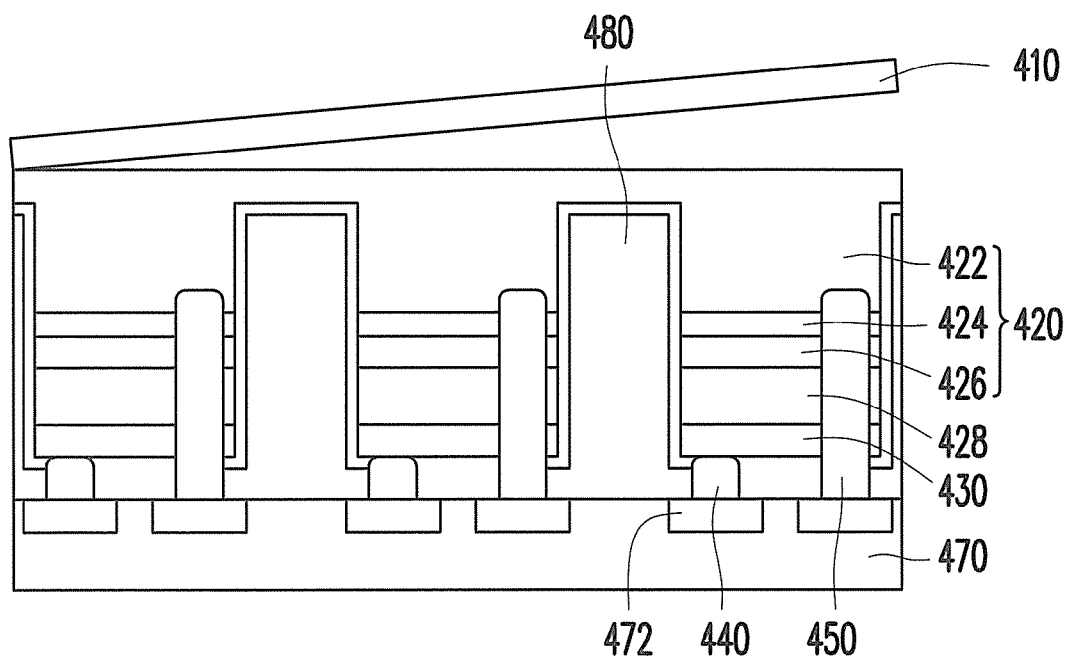
Figure 8D:
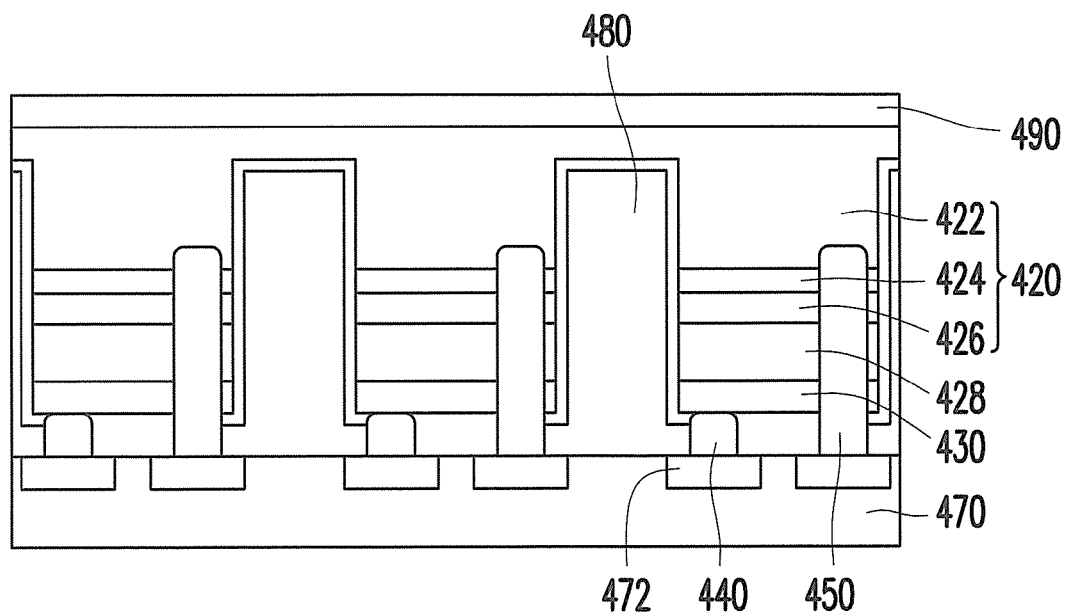
Figure 8E:
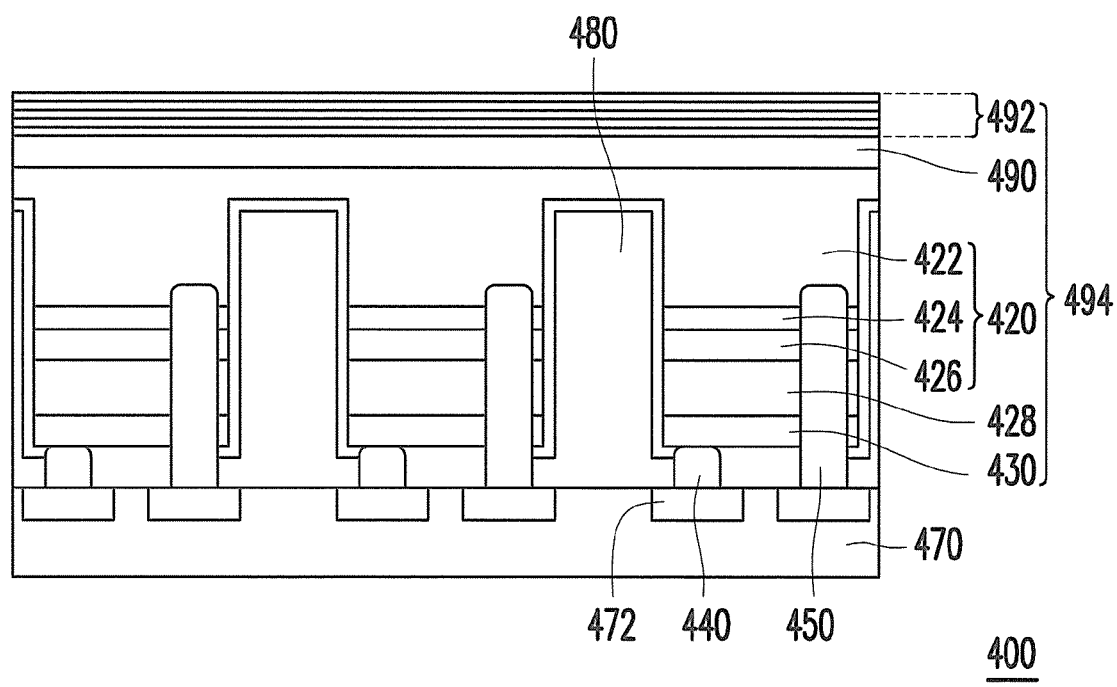

Thereafter, referring to FIG. 8c, the substrate 410 is lifted-off to expose the continuous layer constructed by the first type doped semiconductor layer 422. Subsequently, referring to FIG. 8d and FIG. 8e, the transparent conductive layer 490 and the light collimation structure 492 are formed sequentially on the continuous layer to construct the light emitting unit array 400, wherein the light emitting structures 420, the contact layers 428, the reflection layer 430, the transparent conductive layers 490, and the light collimation structure 492 together construct a plurality of μ-LEDs 494. In the present embodiment, the light collimation structure 492 is the DBR or the ODR continuously formed on the light emitting structures 420 and each of the light emitting structures 420 is sandwiched between the light collimation structure 492 and the reflection layer 430. The light collimation structure 492 has the light reflective function. Therefore, when the thickness of the light emitting structure 420 is properly designed, the light emitted by the light emitting structure 420 can resonate between the light collimation structure 492 and the reflection layer 430 so as to achieve the desirable light collimation effect which is the same as or similar to the first embodiment. That is to say, the light emitting unit array 400 of the present embodiment and the light emitting unit array 200 of the first embodiment can have the same characteristics (good light collimation effect and better light emitting efficiency). The light emitting unit array 400 applied in the projection system 300 depicted in FIG. 7 is conducive to improve the imaging quality of the projection system 300 and reduce the total volume thereof.

Figure 9A:
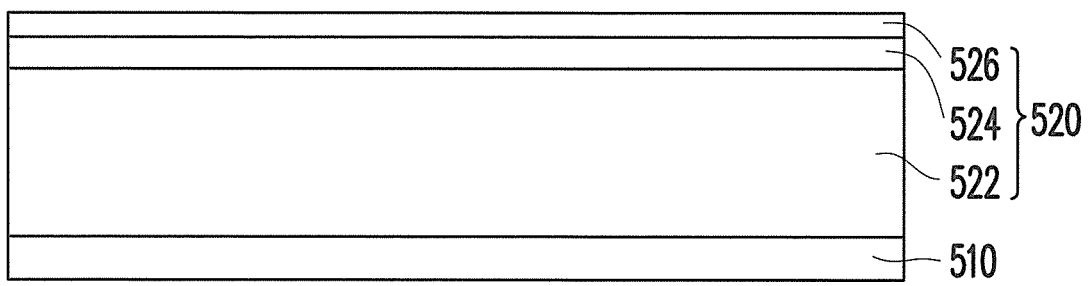
FIGS. 9a through 9g depict a fabricating method of a light emitting unit array according to a third embodiment of the disclosure.

FIGS. 9a through 9g depict a fabricating method of a light emitting unit array according to a third embodiment of the disclosure. Referring to FIG. 9a, the first type doped semiconductor layer 522, the active layer 524, and the second type doped semiconductor layer 526 are sequentially formed on the substrate 510. The substrate 510 is, for example, a sapphire substrate or other suitable substrate facilitating applying in the epitaxy process. The first type doped semiconductor layer 522 can be an n-type doped semiconductor layer and the second type doped semiconductor layer 526 can be a p-type doped semiconductor layer. The n type doped semiconductor material and the p type doped semiconductor material selected in the present embodiment can, for example, be an n type doped GaN and a p type doped GaN. Nevertheless, in one embodiment, the n type doped semiconductor material and the p type doped semiconductor material can be other semiconductor materials doped with required dopant such as GaAlN, GaInN, or other III-V group nitride. The active layer 524 is, for example, an MQW layer.

Figure 9B:
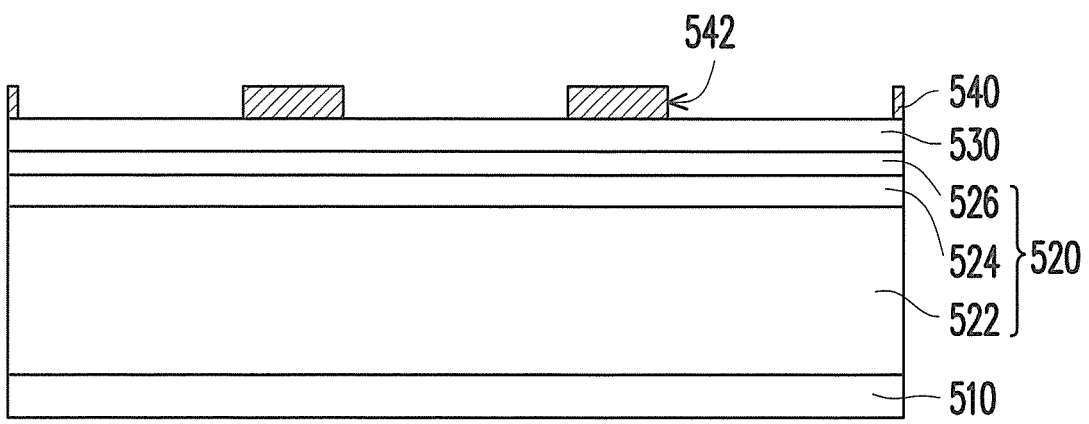

Subsequently, referring to FIG. 9b, the transparent conductive layer 530 and the metal mesh 540 are formed on the second type doped semiconductor layer 526, wherein the metal mesh 540 has a plurality of openings 542.

Figure 9C:
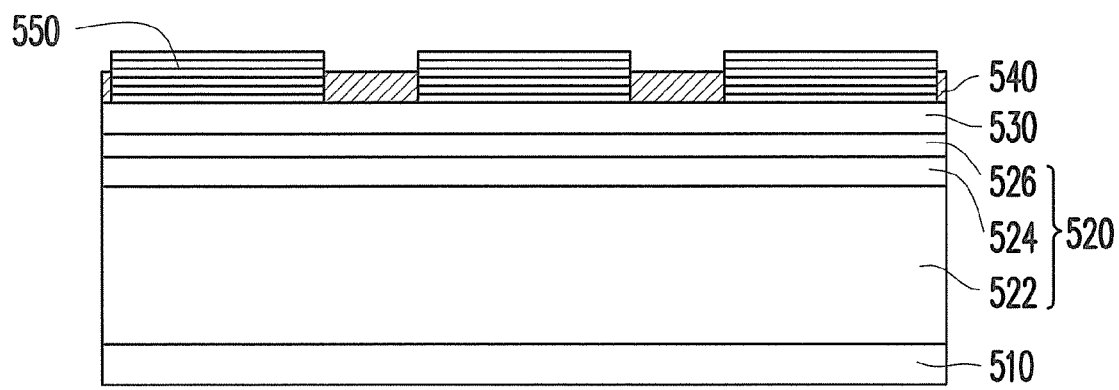

Referring to FIG. 9c, a plurality of light collimation structures 550 are formed in the openings 542 of the metal mesh 540, wherein the light collimation structures 550 can be DBRs or ODRs.

Figure 9D:
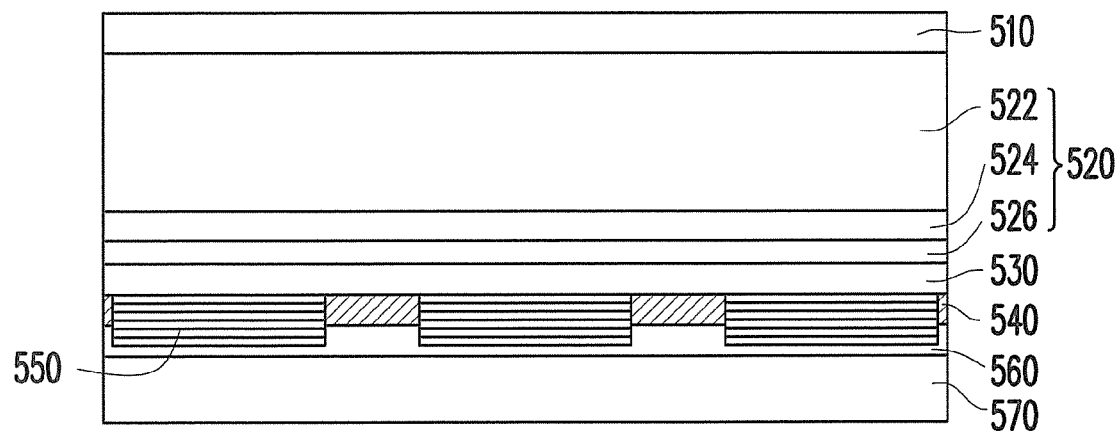
Figure 9E:
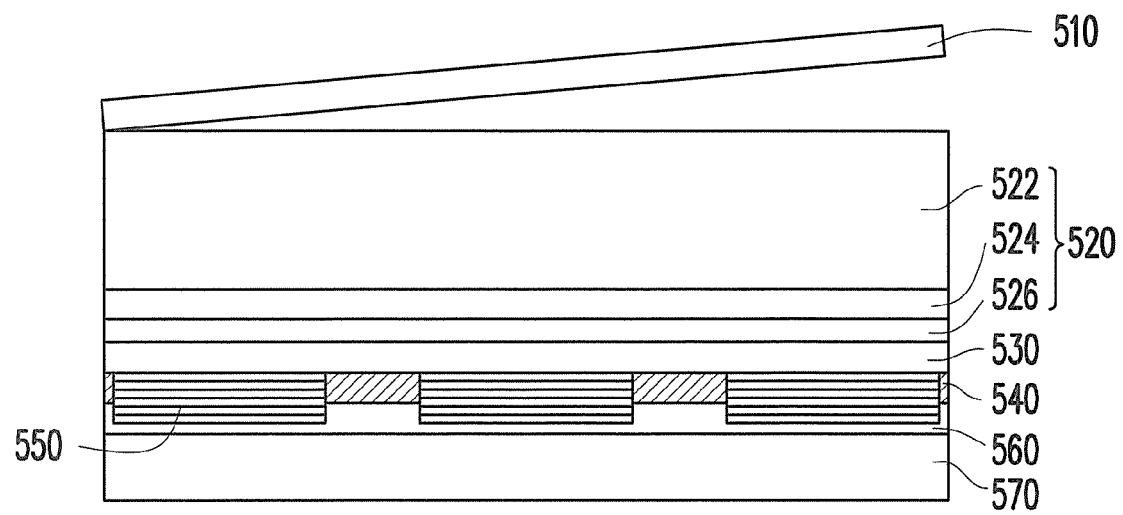
Figure 9F:
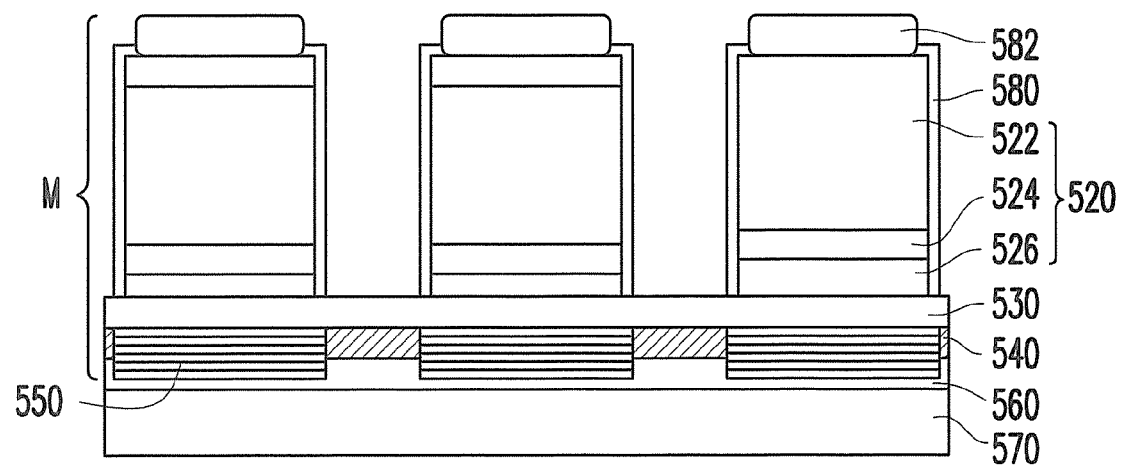

Referring to FIG. 9d, the metal mesh 540 and the light collimation structures 550 are bonded on another substrate 570 through a filling layer 560, wherein the substrate 570 can be a transparent substrate. After the bonding process, the substrate 510 can be lifted-off from the first type doped semiconductor layer 522 as shown in FIG. 9e. As shown in FIG. 9f, the first type doped semiconductor layer 522, the active layer 524, and the second type doped semiconductor layer 526 are patterned into a plurality of light emitting structures 520, a protection layer 580 is formed on the side surfaces of the light emitting structures 520, and the electrodes 582 are formed on the first type doped semiconductor layer 522 of the light emitting structures 520, which form a plurality of μ-LEDs M. The light emitting structure 520, the transparent conductive layer 530, the metal mesh 540, and the light collimation structure 550 are disposed between electrode 582 of each μ-LED M and the substrate 570. In the present embodiment, the material of the electrode 582 can be metal so that the electrode 582 can be served as a reflection layer by having the light reflecting function and the electrically conductive function. In addition, the light collimation structures 550 can be constructed by DBRs or ODRs. Accordingly, when the thickness of the light emitting structure 520 is properly designed, the light emitted by the light emitting structure 520 can resonate between the electrode 582 and the light collimation structure 550. As such, similar to those depicted in the first embodiment, the μ-LED M can provide high desirable light collimation effect and desirable light emitting efficiency.

Figure 9G:
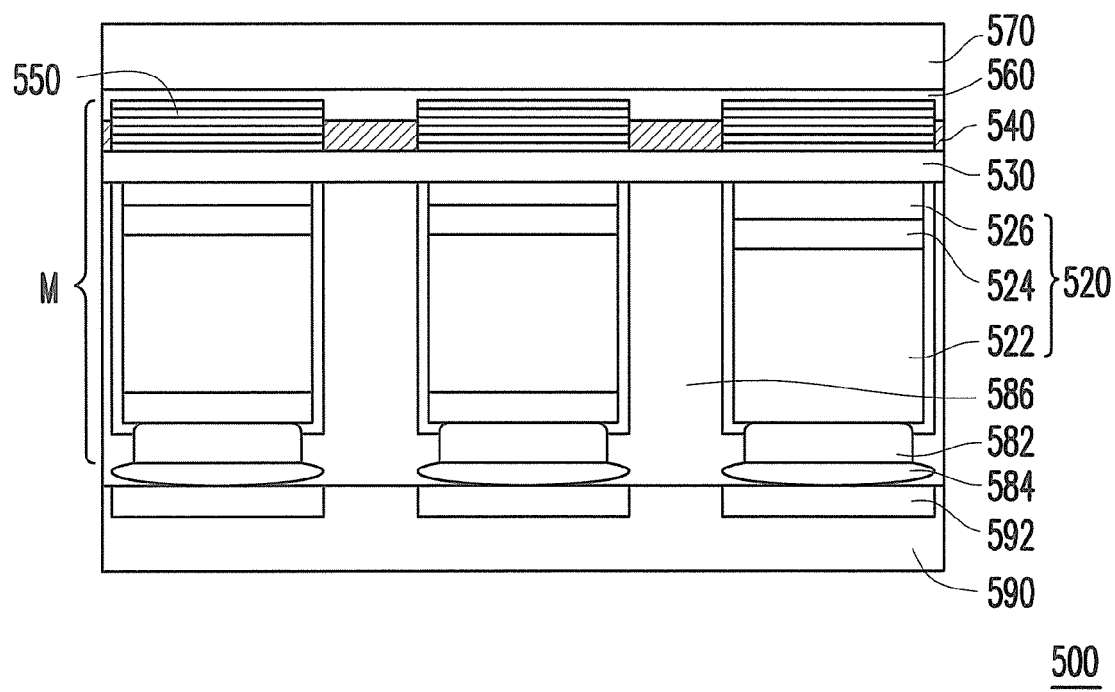

Thereafter, referring to FIG. 9g, the electrodes 582 of the μ-LEDs M are bonded to the substrate 590 through the metal pads 584 to form the light emitting unit array 500, wherein the substrate 590 has a plurality of circuit elements 592 such as MOS elements. In addition, the gap between the μ-LEDs M can be filled with another filling layer 586. Each μ-LED M in the present embodiment can be driven by the corresponding circuit element 592 so that variant μ-LEDs M can emit the light with different brightness and/or color to provide the image displaying function. The μ-LEDs M in the present embodiment can be seen as the pixels for displaying images. Accordingly, the light emitting unit array 500 has the function the same as the light emitting unit array 200 of the projection system 300 depicted in FIG. 7.

Furthermore, each of the μ-LEDs M includes the electrode 582 and the light collimation structure 550 having light reflective function such that the light emitted by the μ-LEDs M can resonate between the two components and be vertically emitted outward. The light emitting characteristic of the μ-LEDs M can be referred to those described in FIG. 5a, FIG. 5b, and FIG. 6 of the first embodiment. In short, the light emitting unit array 500 has the advantages of the light emitting unit array 200. The application of the light emitting unit array 500 in the projection system 300 depicted in FIG. 7 is conducive to reducing the total volume and enhancing the imaging quality thereof.

Certainly, the above embodiments are merely exemplary and should by no means limit the scope of the disclosure. The design facilitating the resonance effect for collimating the emitting light by forming the resonance structure in the μ-LEDs through the components having light reflective function or similar characteristics can comply with the scope of the disclosure. However, it is not limited to make the μ-LED with high desirable light collimation effect through the resonance effect. Several embodiments are provided below to further describe the spirit of the disclosure.

Figure 10:
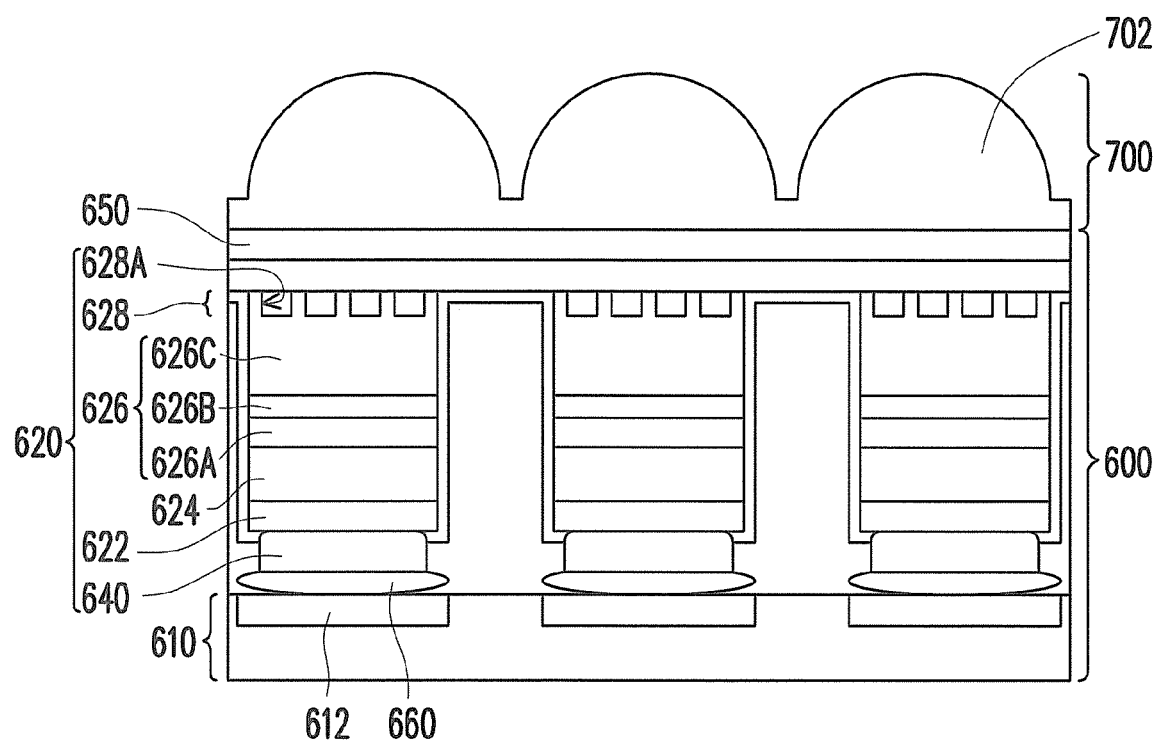
FIG. 10 schematically illustrates a light emitting unit array combined with a μ-lens array according to the fourth embodiment of the disclosure.

FIG. 10 schematically illustrates a light emitting unit array and a μ-lens array according to the fourth embodiment of the disclosure. Referring to FIG. 10, in the present embodiment, the μ-lens array 700 is disposed on the light emitting unit array 600 and has a plurality of μ-lens 702. The light emitting unit array 600 includes a plurality of μ-LEDs 620 arranged in an array on the substrate 610 and each μ-LED 620 is configured with the electrode 640 and the transparent conductive layer 650 at the two opposite sides thereof so as to electrically connected to an external circuit. Each electrode 640 is, for example, bonded to the circuit element 612 on the substrate 610 through the corresponding pad 660.

In the present embodiment, each of the μ-LEDs 620 includes a reflection layer 622, a contact layer 624, a light emitting structure 626, and a light collimation structure 628. The light emitting structure 626 includes the first type doped semiconductor layer 626A, the active layer 525B, and the second type doped semiconductor layer 626C stacking sequentially, wherein the material of the first type doped semiconductor layer 626A and the second type doped semiconductor layer 626C can be respectively an n-type doped semiconductor layer and a p-type doped semiconductor layer or respectively a p-type doped semiconductor layer and an n-type doped semiconductor layers. The n type doped semiconductor material and the p type doped semiconductor material selected in the present embodiment can, for example, be the n type doped GaN and the p type doped GaN. Nevertheless, in one embodiment, the n type doped semiconductor material and the p type doped semiconductor material can be other semiconductor materials doped with required dopant such as GaAlN, GaInN, or other III-V group nitride.

Besides, the light collimation structures 628 have a plurality of concaves 628A. The depth of the concave 628A can be 50 nm to 250 nm. In one embodiment, the concave 628A can be selectively not filled, filled with dielectric material, or filled with DBR while the refractive index of the filling material is different from the refractive index of the second type doped semiconductor layer 626C. Now, the light collimation structure 628 facilitates to change the light path of the light emitted from the light emitting structure 626 so that the μ-LED 620 has the desirable light collimation effect. In short, the light emitting unit array 600 has the advantages of the light emitting unit array 200 of the first embodiment.

Figure 11:
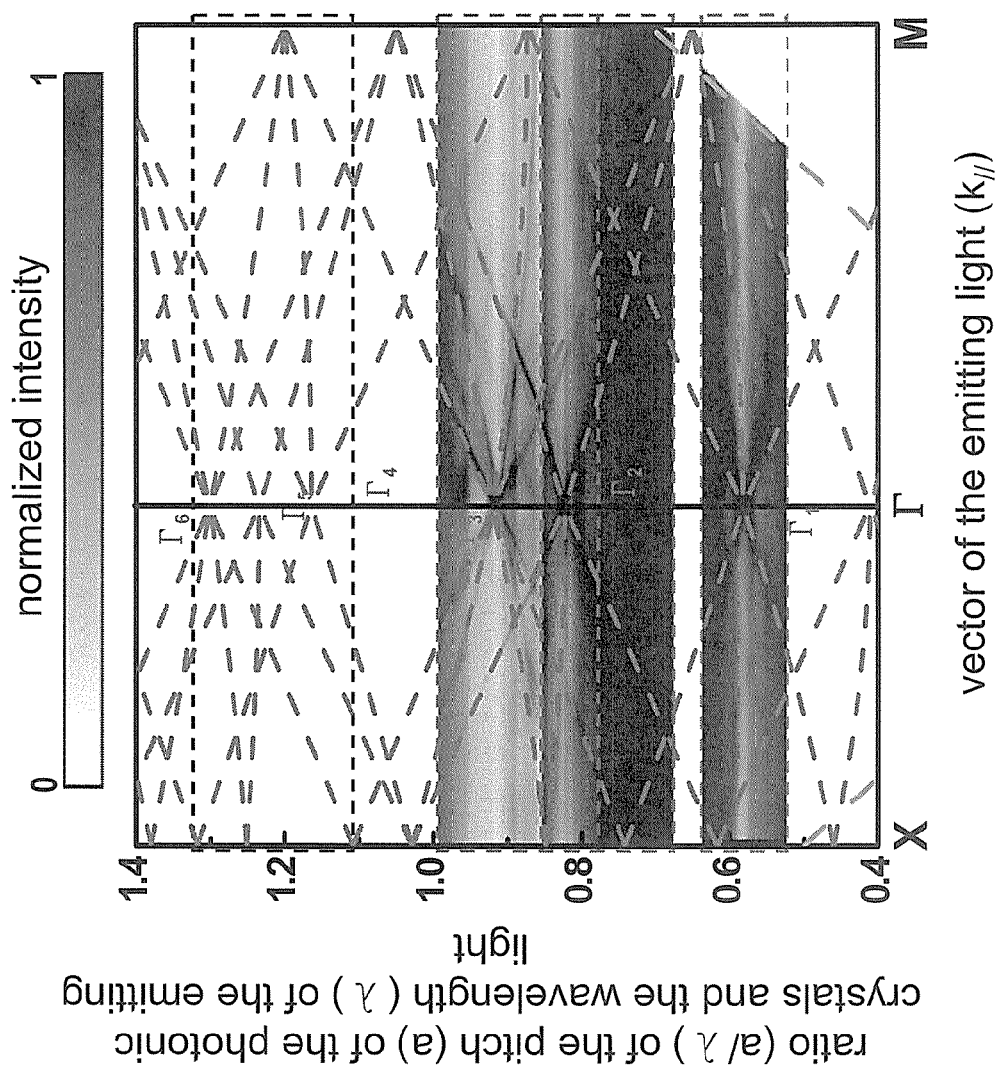
FIG. 11 is the dispersion diagram of the μ-LED showing a vector of the emitting light from the μ-LED and a ratio of the pitch of the photonic crystal structure to the corresponding wavelength of the emitting light.

In the present embodiment, the concaves 628A of the light collimation structure 628 can be periodically arranged to be served as a photonic crystal structure layer. Namely, the design of photonic crystal structure can be used in the embodiment to modify the light emitting effect of the μ-LEDs for achieving the desirable light collimation effect. Generally, the periodic arrangement of the photonic crystal structures and the wavelength of the light emitted by the μ-LED 620 are related to the obtained light emitting angle. FIG. 11 is the dispersion diagram of the μ-LED showing a vector of the light emitted from the μ-LED and a ratio of the pitch of the photonic crystal structure to the corresponding wavelength of the emitting light. In FIG. 11, Γ represents that the vector of the emitting light is parallel to the normal direction of the light emitting surface, i.e. the collimation light emitting direction (zero angle). X and M represent two light emitting directions parallel to the light emitting surface. Based on the relationship shown in FIG. 11, the light emitted by the μ-LED defines several nodes in the dispersion diagram corresponding to Γ. When the ratio of the pitch of the photonic crystal structures and the corresponding wavelength of the emitting light is located at the nodes, the μ-LED can have desirable light collimation effect. Therefore, the pitch of the photonic crystal structures can be determined according to the relationship shown in FIG. 11 and the known wavelength emitted by the μ-LED, which facilitates the μ-LED having the desirable light collimation effect. That is to say, the pitch of the concaves 628A of the light collimation structure 628 depicted in FIG. 10 can be determined according to the nodes in FIG. 11 to make the μ-LED 620 have desirable light emitting effect and prohibit the optical cross talk effect generated between the adjacent μ-LEDs 620 in the light emitting unit array 600.

Figure 12:
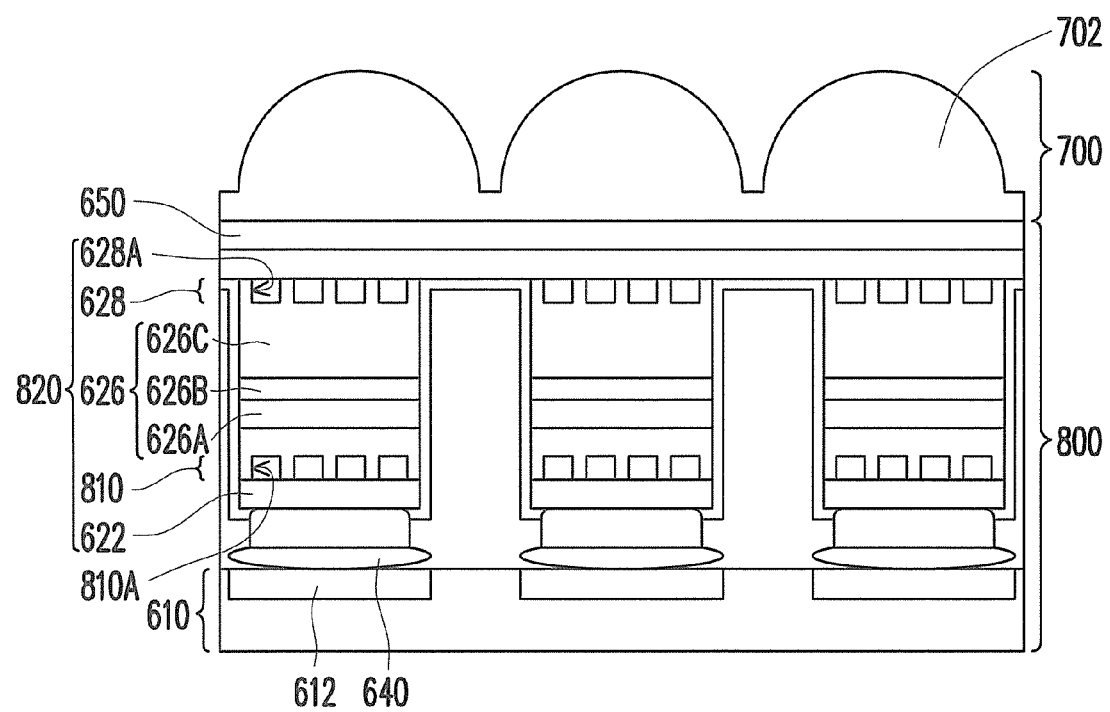
FIG. 12 schematically illustrates a light emitting unit array combined with a μ-lens array according to the fifth embodiment of the disclosure.

FIG. 12 schematically illustrates a light emitting unit array and a μ-lens array according to the fifth embodiment of the disclosure. Referring to FIG. 12, the design of the present embodiment is substantially identical to the fourth embodiment, and the same elements are represented by the same reference numbers. Therefore, no further descriptions are provided herein. The difference between the present embodiment and the four the embodiment mainly lies in that in the light emitting unit array 800 of the present embodiment, the light collimation structure 628 of each μ-LED 820 is the photonic crystal structure layer and in addition to the components of the μ-LED 620, the μ-LED 820 further includes another photonic crystal structure layer 810 disposed between the light emitting structure 626 and the reflection layer 622 of each μ-LED 820. Namely, each μ-LED 820 of the present embodiment has two photonic crystal structure layers (the photonic crystal structure layer 810 and the light collimation structure 628 achieved by the photonic crystal structure) and the light emitting structure 626 is located between the two photonic crystal structure layers. The photonic crystal structure layer 810 similarly has a plurality of concaves 810A and the pitch of the concaves 810A can be determined according to the nodes shown in the relationship depicted in FIG. 11. The concaves 628A can be selectively not filled or filled with reflective material the same as the material of the reflection layer 622. That is to say, the reflective material filled in the concaves 810A can be formed integrally with the reflection layer 622, but the disclosure is not limited thereto. The photonic crystal structure layer 810 and the light collimation structure 628 facilitates to change the light path of the light emitted from the light emitting structure 820 so that the μ-LED 620 has the desirable light collimation effect. In short, the light emitting unit array 800 has the advantages of the light emitting unit array 200 of the first embodiment and can be applied in the projection system.

In view of the above, the light collimation structure having light reflective function or capable of changing the light path is configured in the μ-LEDs of the light emitting unit array in the disclosure. Therefore, each μ-LED of the light emitting unit array can have desirable light collimation effect and light emitting efficiency. When the light emitting unit array is applied in the projection system, the light emitting unit array can directly display images so that no additional display panel is required so as to reduce the total volume thereof. The application of the light emitting unit arrays in the projection systems is conducive to enhancing the imaging quality thereof by prohibiting the optical cross talk effect. The application of the light emitting unit arrays having desirable light emitting efficiency in the projection systems is further conducive to enhancing the imaging quality.

Although the disclosure has been described with reference to the above embodiments, it will be apparent to one of the ordinary skill in the art that modifications to the described embodiment may be made without departing from the spirit of the disclosure. Accordingly, the scope of the disclosure will be defined by the attached claims not by the above detailed descriptions.

What is claimed is:

1. A light emitting unit array, comprising:
a plurality of micro-light emitting diodes arranged in an array on a substrate, each of the micro-light emitting diodes comprising:
a reflection layer;
a light emitting structure disposed on the reflection layer, and the light emitting structure comprising a first type doped semiconductor layer, an active layer, and a second type doped semiconductor layer that are stacked sequentially; and
a light collimation structure, wherein at least a portion of the first type doped semiconductor layer, the active layer, and the second type doped semiconductor layer are sandwiched between the reflection layer and the light collimation structure, and the light collimation structure of each of the micro-light emitting diodes is buried in the first type doped semiconductor layer.

2. The light emitting unit array as claimed in claim 1, wherein the light collimation structure of each of the micro-light emitting diodes comprises a distributed Bragg reflector or an omni-directional reflector.

3. The light emitting unit array as claimed in claim 2, wherein a thickness of the light emitting structure of each of the micro-light emitting diodes located between the light collimation structure and the reflection layer is L, the wavelength of the light emitted from the active layer is λ, and L and λ complies with L=n/2λ while n is an integer and ranges between 3 and 20.

4. The light emitting unit array as claimed in claim 1, wherein the light collimation structures of the micro-light emitting diodes are connected with one another to form a continuous distributed Bragg reflector layer.

5. The light emitting unit array as claimed in claim 1, wherein the light collimation structure of each of the micro-light emitting diodes has a plurality of concaves.

6. The light emitting unit array as claimed in claim 5, further comprising a plurality of distributed Bragg reflectors, wherein each of the distributed Bragg reflectors fills one of the concaves.

7. The light emitting unit array as claimed in claim 5, wherein the concaves of the light collimation structure are arranged periodically to form a first photonic crystal structure layer.

8. The light emitting unit array as claimed in claim 7, wherein the concaves of the first photonic crystal structure layer are filled with dielectric material.

9. The light emitting unit array as claimed in claim 7, wherein each of the micro-light emitting diodes further comprises a second photonic crystal structure layer disposed between the light emitting structure and the reflection layer.

10. The light emitting unit array as claimed in claim 9, wherein the second photonic crystal structure layer has a plurality of concaves filled with reflective material and the reflective material is the same as the material of the reflection layer.

11. A projection system, comprising:
a display unit array comprising a plurality of micro-light emitting diodes arranged in an array on a substrate, and each of the micro-light emitting diodes comprising:
a reflection layer;
a light emitting structure disposed on the reflection layer, and the light emitting structure comprising a first type doped semiconductor layer, an active layer, and a second type doped semiconductor layer that are stacked sequentially; and
a light collimation structure, wherein at least a portion of the first type doped semiconductor layer, the active layer, and the second type doped semiconductor layer are sandwiched between the reflection layer and the light collimation structure, and the light collimation structure of each of the micro-light emitting diodes is buried in the first type doped semiconductor layer; and
a projection lens set located at the light path of the displaying light of the display unit array.

12. The projection system as claimed in claim 11, wherein the light collimation structure of each of the micro-light emitting diodes comprises a distributed Bragg reflector or an omni-directional reflector.

13. The projection system as claimed in claim 12, wherein a thickness of the light emitting structure of each of the micro-light emitting diodes located between the light collimation structure and the reflection layer is L, the wavelength of the light emitted from the active layer is $\lambda$, and L and $\lambda$ complies with $L=n/2\lambda$ while n is an integer and $3<n<20$.

14. The projection system as claimed in claim 11, wherein the light collimation structure of each of the micro-light emitting diodes has a plurality of concaves.

15. The projection system as claimed in claim 14, further comprising a plurality of distributed Bragg reflectors, wherein each of the distributed Bragg reflectors fills one of the concaves.

16. The projection system as claimed in claim 14, wherein the concaves of the light collimation structure are arranged periodically to form a first photonic crystal structure layer.

17. The projection system as claimed in claim 16, wherein the concaves of the first photonic crystal structure layer are filled with dielectric material.

18. The projection system as claimed in claim 16, wherein each of the micro-light emitting diodes further comprises a second photonic crystal structure layer disposed between the light emitting structure and the reflection layer.

19. The projection system as claimed in claim 18, wherein the second photonic crystal structure layer has a plurality of concaves filled with reflective material and the reflective material is the same as the material of the reflection layer.

20. The projection system as claimed in claim 11, further comprising a micro-lens array formed by a plurality of micro-lens and each of the micro-lens being disposed on one of the micro-light emitting diodes.

* * * * *